(12) United States Patent
Wang et al.

(10) Patent No.: US 7,705,348 B2
(45) Date of Patent: Apr. 27, 2010

(54) SEMICONDUCTOR LIGHT-EMITTING DEVICE WITH ELECTRODE FOR N-POLAR INGAAIN SURFACE

(75) Inventors: Li Wang, Jiang Xi (CN); Fengyi Jiang, Jiang Xi (CN); Maoxing Zhou, Jiang Xi (CN); Wenqing Fang, Jiang Xi (CN)

(73) Assignee: Lattice Power (Jiangxi) Corporation, Nanchang (CN)

( * ) Notice: Subject to any disclaimer, the term of this patent is extended or adjusted under 35 U.S.C. 154(b) by 71 days.

(21) Appl. No.: 12/063,974

(22) PCT Filed: Oct. 26, 2006

(86) PCT No.: PCT/CN2006/002870

§ 371 (c)(1),
(2), (4) Date: Feb. 15, 2008

(87) PCT Pub. No.: WO2007/048345

PCT Pub. Date: May 3, 2007

(65) Prior Publication Data

US 2008/0230799 A1    Sep. 25, 2008

(51) Int. Cl.
*H01L 29/40* (2006.01)

(52) U.S. Cl. .............. 257/44; 257/81; 257/99; 257/E21.537

(58) Field of Classification Search .......... 257/12, 257/13, 44, 79, 81, 84, 85, 99, E21.537
See application file for complete search history.

(56) References Cited

U.S. PATENT DOCUMENTS

2005/0218414 A1* 10/2005 Ueda et al. ............. 257/94
2007/0023775 A1*  2/2007 Jang .......................... 257/99

FOREIGN PATENT DOCUMENTS

EP    1885001 A1    2/2008

* cited by examiner

*Primary Examiner*—Evan Pert
*Assistant Examiner*—Scott R Wilson
(74) *Attorney, Agent, or Firm*—Park, Vaughan & Fleming LLP

(57) ABSTRACT

One embodiment of the present invention provides a semiconductor light-emitting device. The semiconductor light-emitting device includes a substrate, a p-type doped InGaAIN layer, an n-type doped InGaAIN layer, and an active layer situated between the p-type doped and n-type doped InGaAIN layers. The semiconductor light-emitting device further includes an n-side Ohmic-contact layer coupled to an N-polar surface of the n-type doped InGaAIN layer. The Ohmic-contact layer comprises at least one of Au, Ni, and Pt, and at least one of group IV elements.

9 Claims, 2 Drawing Sheets

SEMICONDUCTOR LIGHT-EMITTING DEVICE WITH ELECTRODE FOR N-POLAR INGAAIN SURFACE

BACKGROUND

1. Field of the Invention

The present invention relates to the design of semiconductor light-emitting devices. More specifically, the present invention relates to a semiconductor light-emitting device with an electrode that can form a low-resistance conductive path to an N-polar surface of an InGaAlN layer.

2. Related Art

Solid-state lighting is expected to be the illumination wave of the future. High-brightness light-emitting diodes (HB-LEDs) are beginning to penetrate an increasing number of applications, especially as light source for display devices and as light-bulb replacement for conventional lighting. Operation voltage, along with brightness and efficiency, are essential performance metrics for LEDs.

An LED typically produces light from an active region, which is situated between a positively-doped layer (p-type doped layer) and negatively-doped layer (n-type doped layer). When the LED is forward-biased, the carriers, which include holes from the p-type cladding layer and electrons from the n-type cladding layer, recombine in the active region. For direct band-gap materials, this recombination process releases energy in the form of photons, or light, the wavelength of which corresponds to the band-gap energy of the material in the active region.

The recently developed group III nitride ($In_xGa_yAl_{1-x-y}N$, $0<=x<=1$, $0<=y<=1$)-based LEDs not only extend the LED emission spectrum to the green, blue, and ultraviolet region, but also can achieve high light emission efficiency. InGaAlN-based LEDs thus have significantly expanded the application field of LEDs. In the following description, "InGaAlN" or "GaN" material generally refers to the Wurtzite $In_xGa_yAl_{1-x-y}N$ ($0<=x<=1$, $0<=y<=1$) materials, which can be a binary, ternary, or quaternary compound, such as GaN, GaAlN, InGaN, and InGaAlN.

A key property of the Wurtzite group III nitrides is their large spontaneous and piezoelectric polarization, which can significantly influence a device's electrical characteristics. The two polarities exhibited by an InGaAlN layer are the Ga-face polarity and N-face polarity, which are also referred to as the (0001) surface and (0001) surface, respectively. Generally, the InGaAlN epitaxial layers are formed using a chemical vapor deposition (CVD) process. During the CVD process, the growth surface facing away from the substrate typically exhibits a Ga-face polarity, regardless of the substrate material. Hence, the Ohmic-contact electrodes are mostly based on materials which can form a low-resistance conductive path to the Ga-polar surface of an InGaAlN layer.

In recent years, researchers have been experimenting with wafer-bonding techniques to construct vertical-electrode LEDs. During wafer bonding, a second support wafer is bonded to the top of the LED multilayer structure, and the initial growth substrate on which the device is epitaxially formed is removed. The entire device is then "flipped" upside-down. As a result, the GaN layer which is previously at the "bottom" of the device is now at the "top." An Ohmic-contact electrode is then deposited on the GaN layer on the top. However, the surface of the flipped GaN layer which is exposed after the initial growth layer is removed typically exhibits an N-face polarity and has drastically different Ohmic-contact characteristics than a Ga-polar surface. For example, Al, a common electrode material used for a Ga-polar surface, can actually form an AlN layer and consequently a depletion region when in contact with an N-polar surface. This depletion layer can increase the potential barrier at the metal-semiconductor interface and raise the turn-on voltage threshold of the LED.

Hence, what is needed is an electrode capable of forming a low-resistance conductive path to the N-polar surface of an InGaAlN layer to produce a desirable Ohmic-contact which does not significantly increase the LED's turn-on voltage.

SUMMARY

One embodiment of the present invention provides a semiconductor light-emitting device. The semiconductor light-emitting device includes a substrate, a p-type doped InGaAlN layer, an n-type doped InGaAlN layer, and an active layer situated between the p-type doped and n-type doped InGaAlN layers. The semiconductor light-emitting device further includes an n-side Ohmic-contact layer coupled to an N-polar surface of the n-type doped InGaAlN layer. The Ohmic-contact layer comprises at least one of Au, Ni, and Pt, and at least one of group IV elements.

In a variation of this embodiment, the n-side Ohmic-contact layer does not contain Al.

In a variation of this embodiment, the n-side Ohmic-contact layer comprises at least one of Au, Ni, and Pt and at least one of Si, Ge, and C.

In a variation of this embodiment, the n-side Ohmic-contact layer comprises Au, and Ge.

In a further variation, the n-side Ohmic-contact layer comprises Au, Ge, and Ni. The weight percentage of Ni in the n-side Ohmic-contact layer is not greater than 15%. The weight percentage of Ge in the n-side Ohmic-contact layer is not less than 10% and not greater than 15%. The weight percentage of Au in the n-side Ohmic-contact layer is not less than 80% and not greater than 90%.

In a variation of this embodiment, the n-side Ohmic-contact layer comprises one or more of: Au/Ge alloy, Ni/Ge alloy, Au/Si alloy, Ni/Si alloy, and Au/Ni/Si alloy.

In a variation of this embodiment, the semiconductor light-emitting device further includes a Ni layer coupled to the n-side Ohmic-contact layer.

In a variation of this embodiment, the semiconductor light-emitting device further includes a Au layer coupled to the n-side Ohmic-contact layer.

In a variation of this embodiment, the semiconductor light-emitting device further comprises a p-side Ohmic-contact layer coupled to the p-type doped InGaAlN layer and a bonding-material layer between the substrate and the p-side Ohmic-contact layer.

In a further variation, the bonding-material layer comprises Au.

In a variation of this embodiment, the substrate comprises Si or Cr.

DETAILED DESCRIPTION

The following description is presented to enable any person skilled in the art to make and use the invention, and is provided in the context of a particular application and its requirements. Various modifications to the disclosed embodiments will be readily apparent to those skilled in the art, and the general principles defined herein may be applied to other embodiments and applications without departing from the scope of the present invention. Thus, the present invention is not limited to the embodiments shown, but is to be accorded the widest scope consistent with the claims.

Conventional InGaAlN LEDs

As a result of Wurtzite GaN polarity, an InGaAlN layer can have two surfaces with different polarities, a Ga-polar surface and an N-polar surface. A Ga-polar surface generally refers to a surface terminating on a layer of Ga atoms, each of which has one unoccupied bond normal to the surface. Each surface Ga atom is bonded to three N atoms in the direction away from the surface.

An N-polar surface generally refers to a surface terminating on a layer of N atoms, each of which has one unoccupied bond normal to the surface. Each surface N atom is also bonded to three Ga atoms in the direction away from the surface.

In a conventional InGaAlN LED structure, an epitaxially grown InGaAlN layer usually has a Ga-polar surface facing away from the substrate. Hence, an Ohmic-contact electrode formed on the InGaAlN layer typically interfaces with the Ga atoms. When the InGaAlN layer is n-type doped, the electrode materials ideally have a work function smaller than the work function of the semiconductor to form a high conductivity interface. Materials with small work functions include Ti and Al. When the InGaAlN layer is p-type doped, the electrode materials ideally have a work function greater than the work function of the semiconductor to form a high conductivity region. Materials with high work functions include Au, Ni, and Pt.

Figure 1:
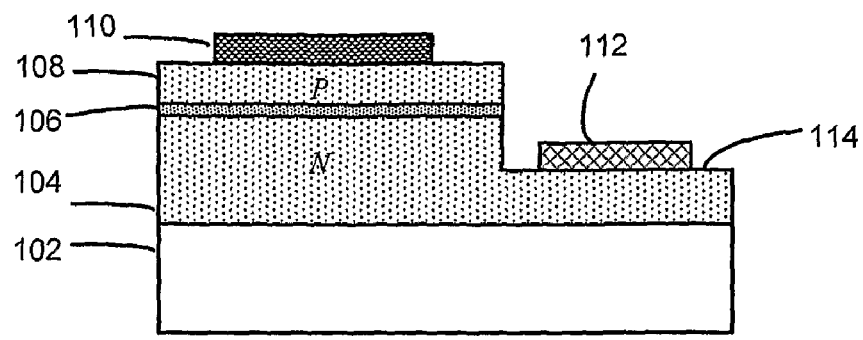
FIG. 1 illustrates an exemplary structure of a lateral-electrode LED where the n-side electrode is coupled to a Ga-polar surface of an n-type doped InGaAlN layer.

FIG. 1 illustrates an exemplary structure of a lateral-electrode LED where the n-side electrode is coupled to a Ga-polar surface of an n-type doped InGaAlN layer. A substrate 102 may be based on Si, sapphire, or SiC. An n-type doped InGaAlN layer 104 is etched away at a certain location below an active layer 106 to provide space 114 for an n-side electrode 112. Note that surface 114 generally exhibits a Ga-face polarity, and electrode 112 can include Ti, Al, or both. Active layer 106 is "sandwiched" between a p-type doped layer 108 and lower layer 104. Above p-type doped layer 108 is a p-side electrode 110, which is a layer of conductive or low-resistance material.

In recent years, substrate-transfer technologies have been adopted to improve the light-emitting efficiency and to reduce the fabrication costs associated with the lateral-electrode configuration. For instance, an InGaAlN multilayer structure may be formed on a sapphire wafer, and then bonded to another wafer, with the sapphire growth substrate removed using laser lift-off. Alternatively, an InGaAlN multilayer structure can be formed on a silicon wafer and then bonded to another wafer, with the silicon substrate removed using chemical etching.

However, the substrate-transfer process now exposes the "bottom," or the N-polar surface, instead of the Ga-polar surface, of the InGaAlN layer. Studies have shown that materials traditionally used for electrodes interfacing with a Ga-polar surface, such as Ti/Al, cannot provide a low-resistance conductive path to the N-polar InGaAlN layer.

Novel Electrodes for N-Polar InGaAlN Layer

When an exposed N-polar surface belongs to an n-type doped InGaAlN layer, traditional wisdom is that low work-function materials should be used. However, experiments have shown that the metal-semiconductor junction formed with these materials actually exhibits high resistance where the adjacent surface is N-polar.

Unexpected to a person skill in the art, certain high work-function metals, which are traditionally considered to be p-type electrode materials, can achieve more desirable results. Embodiments of the present invention combine high work-function metals with group IV materials to fabricate low-resistance electrodes interfacing with an N-polar surface of an n-type doped InGaAlN layer.

One embodiment of the present invention uses Au, Ge, and Ni to form an n-type electrode which exhibits low resistance on a N-polar n-type doped InGaAlN surface. Preferably, the weight composition of the Au/Ge/Ni electrode is: 0-5% Ni, 10%-15% Ge, and 80%-90% Au. Other material combinations are also possible. Such combinations include, but are not limited to: Au/Ge, Ni/Ge, Au/Si, Ni/Si, Au, and Ni/Si. In a further embodiment, the Au/Ge/Ni electrode does not include Al, which prevents formation of a AlN depletion region.

The novel electrode can further include additional metal layers. For example, the electrode can include a Au/Ge/Ni layer which interfaces with the N-polar InGaAlN surface, a Ni layer above the Au/Ge/Ni layer, and a Au layer above the Ni layer.

Figure 2:
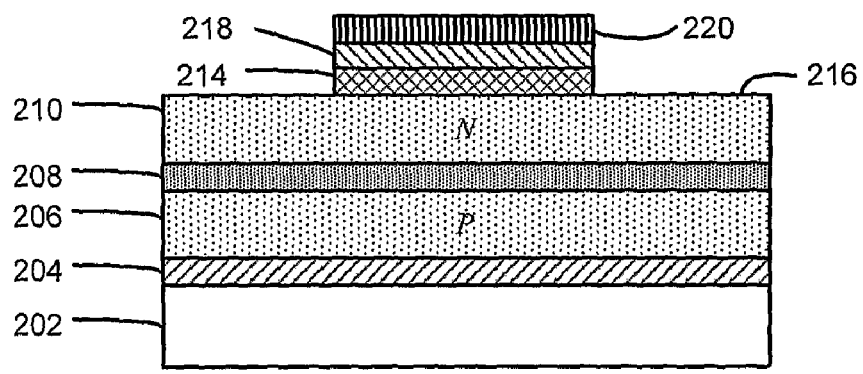
FIG. 2 illustrates an Ohmic-contact electrode coupled to the N-polar surface of an n-type doped InGaAlN layer in accordance with one embodiment of the present invention.

FIG. 2 illustrates an Ohmic-contact electrode coupled to the N-polar surface of an n-type doped InGaAlN layer in accordance with one embodiment of the present invention. An LED multilayer structure includes a p-type doped layer 206, a multi-quantum-well active layer 208, and an n-type doped layer 210. Below p-type doped layer 206 is a p-side Ohmic-contact layer 204. The multilayer structure is supported by a substrate 202, which in this example is a chromium (Cr) substrate.

Above n-type doped InGaAlN layer 210 is a Au/Ge/Ni electrode Ohmic-contact layer 214 which is patterned and etched for form an electrode. In one embodiment, Ohmic-contact layer 214 contains 2% Ni, 12% Ge, and 88% Au measured in weight percentage. Note that Au/Ge/Ni layer 214 forms a low-resistance Ohmic contact with the N-polar InGaAlN surface 216. In addition, Au/Ge/Ni layer 214 is covered by a Ni layer 218 and a Au layer 220. These additional metal layers can facilitate the subsequent bonding of conductive wire or other materials.

In one embodiment, substrate 202 can comprise any conductive material. Further, a layer of bonding material can be present between p-type doped layer 206 and substrate 202. In a preferred embodiment, substrate 202 comprises a material with a high electrical conductivity and thermal conductivity and which is resistant to chemical wet etching. In a further embodiment, substrate 202 can be based on conductive Si.

Furthermore, n-type doped layer 210 and p-type doped layer 206 can include one or more layers which can further be based on a super-lattice structure or a modulation-doped structure. In addition, active layer 208 can be based on a double hetero-junction, single-quantum-well, or multi-quantum-well structure.

The fabrication of Ohmic-contact layers 214, 218, and 220 can be based on any physical vapor deposition (PVD) or CVD process. In one embodiment, the Au/Ge/Ni layer is deposited with a sputtering or electron-beam evaporation process.

In one embodiment, the device as is illustrated in FIG. 2 can be fabricated based on the following process. First, a AlN buffer layer is formed on a Si growth substrate using CVD. Subsequently, n-type doped InGaAlN layer 210, InGaN/GaAlN multi-quantum-well active layer 208, and p-typed doped InGaAlN layer 206 are formed on the buffer layer. The epitaxial structure is then subjected to a 760° C. annealing process to activate the p-type dopant. A p-side Ohmic-contact layer 204 is then deposited on p-type doped layer 206, and a 30-micron thick Cr support substrate 202 is deposited over Ohmic-contact layer 204.

Next, the entire structure is subjected to chemical wet etching to remove the initial growth Si substrate. Reactive ion etching (RIE) is then used to remove the buffer layer and to expose the n-type doped InGaAlN layer 210. Au/Ge/Ne electrode layer 214 which is 1000 angstroms thick is deposited. Additionally, a 200-angstrom thick Ni layer 218 and an 8000-angstrom thick Au layer 220 are further deposited, patterned, and etched to form an n-side electrode. The structure is then subjected to a 350° C. $N_2$ environment for three minutes for Au/Ge/Ni layer 214 to form an alloy. A final device is obtained after wafer dicing and device packaging.

Figure 3:
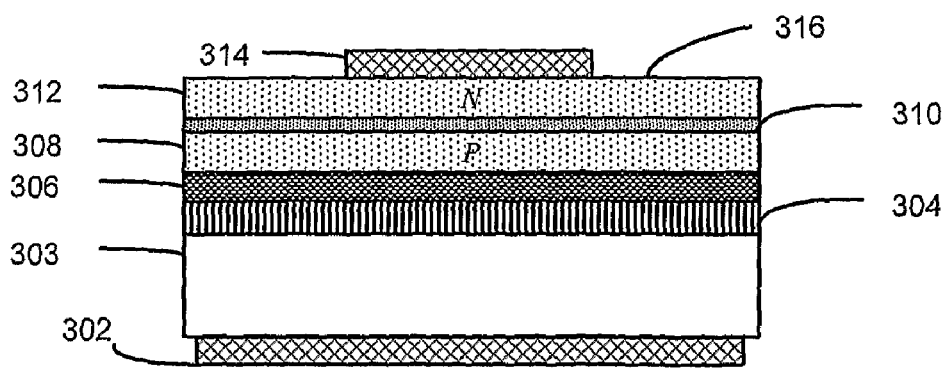
FIG. 3 illustrates an LED structure with an Ohmic-contact electrode coupled to the N-polar surface of an n-type doped InGaAlN layer in accordance with one embodiment of the present invention.

FIG. 3 illustrates an LED structure with an Ohmic-contact electrode coupled to the N-polar surface of an n-type doped InGaAlN layer in accordance with one embodiment of the present invention. In this example, an LED multilayer structure includes a p-type doped layer 308, a single-quantum-well active layer 310, and an n-type doped layer 312. Above n-type doped layer 312 is a Au/Ge layer 314 which forms a low-resistance Ohmic-contact with an N-polar surface 316 of n-type doped InGaAlN layer 312. In one embodiment, Au/Ge layer 314 contains 86% Au and 14% Ge measured in weight percentage.

Below p-type doped layer 308 is a p-side Ohmic-contact layer 306, a bonding-material layer 304, and a Si substrate layer 303. Furthermore, a backside electrode layer 302 is deposited on the backside of Si substrate 303.

In one embodiment, the device as is illustrated in FIG. 3 can be fabricated based on the following process. First, a AlN buffer layer is formed on a Si growth substrate using CVD. Subsequently, n-type doped InGaAlN layer 312, InGaN/GaAlN single-quantum-well active layer 310, and p-typed doped InGaAlN layer 308 are formed on the buffer layer. The epitaxial structure is then subjected to a 760° C. annealing process to activate the p-type dopant. A p-side Ohmic-contact layer 306 is then deposited on p-type doped layer 308, and bonding-material layer 304 is deposited over p-side Ohmic-contact layer 306.

Next, support Si substrate 303 is bonded to bonding-material layer 304. Backside electrode layer 302 is then deposited on support substrate 303. The entire structure is subsequently subjected to chemical wet etching to remove the initial growth Si substrate. Note that, during the wet etching process, backside electrode layer 302 protects support substrate 303 from being etched away.

RIE is then used to remove the buffer layer and to expose the n-type doped InGaAlN layer 312. Au/Ge electrode layer 314 which is 8000 angstroms thick is deposited, patterned, and etched to form an n-side electrode. The structure is then subjected to a 300° C. $N_2$ environment for five minutes for Au/Ge layer 314 to form an alloy. A final device is obtained after wafer dicing and device packaging.

Figure 4:
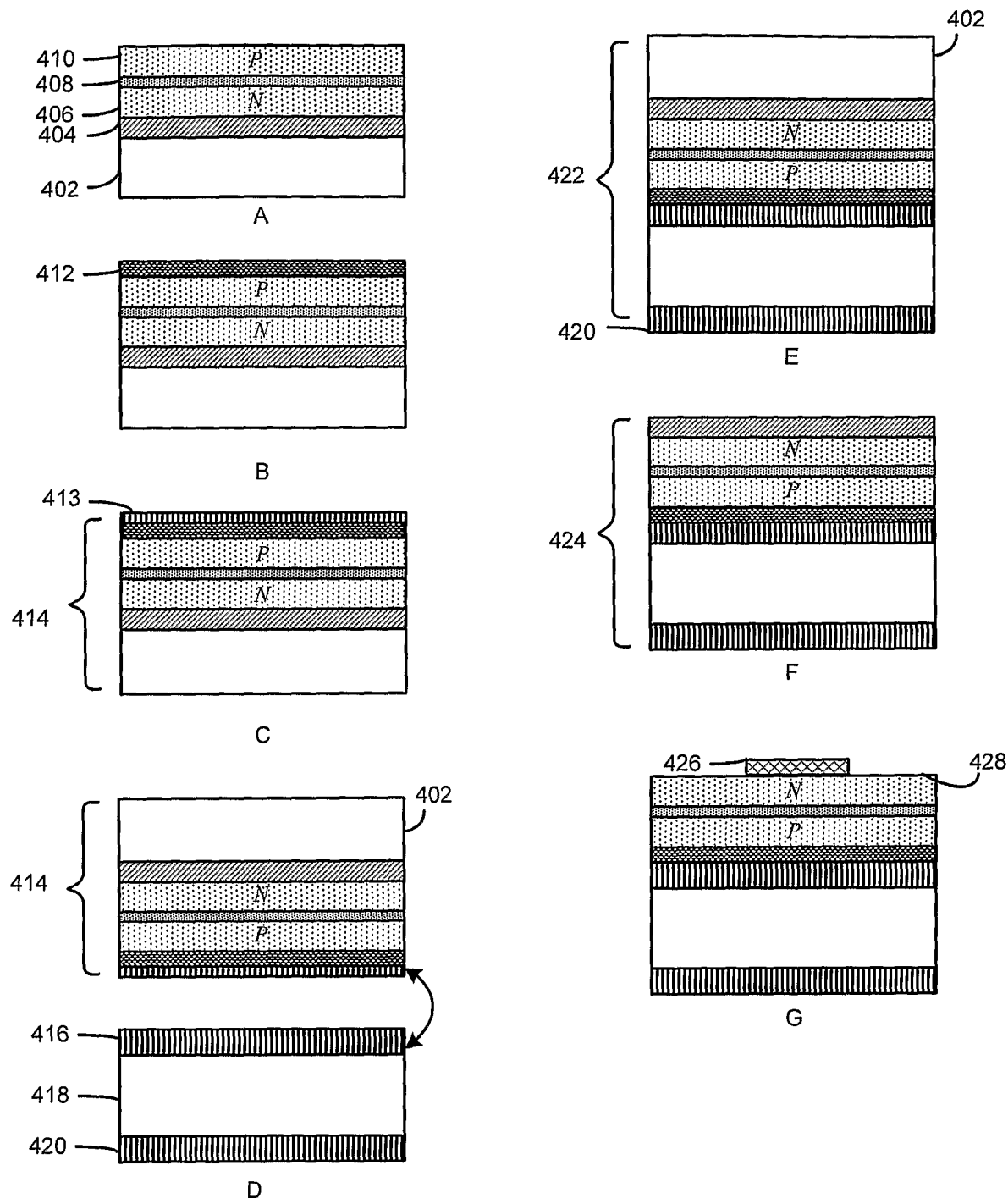
FIG. 4 illustrates a process for fabricating an LED with an Ohmic-contact electrode coupled to the N-polar surface of an n-type doped InGaAlN layer in accordance with one embodiment of the present invention.

FIG. 4 illustrates a process for fabricating an LED with an Ohmic-contact electrode coupled to the N-polar surface of an n-type doped InGaAlN layer in accordance with one embodiment of the present invention. In Step A, a basic InGaAlN light-emitting layered structure is formed through the generally known InGaAlN device fabrication process. Typically, a buffer layer 404 is grown on a Si substrate 402. An n-type InGaAlN layer 406 is then grown on buffer layer 404. In one embodiment, an InGaAlN multi-quantum-well active layer 408 and a p-type InGaAlN layer 410 are formed on n-type InGaAlN layer 406. CVD can be used to fabricate these layers. In a further embodiment, the layered structure is placed in a 760° C. $N_2$ environment for approximately 20 minutes for the purpose of annealing.

In Step B, an Ohmic-contact electrode 412 is formed on the Ga-polar surface of the p-type InGaAlN layer 410. This layer may be fabricated using PVD methods, such as electron-beam evaporation, filament evaporation, or sputter deposition. Ohmic-contact layer 412 can also be based on reflective materials. Preferably, at least 30% of Ohmic-contact layer 412 is a reflective material.

In Step C, a bonding metal layer 413 is deposited over Ohmic-contact layer 412. In one embodiment, bonding metal layer 413 contains Au.

In Step D, the entire layered structure 414 obtained in Step C is flipped upside down and bonded to a second Si substrate 418, which has low resistance. In addition, the bonding side of substrate 418 is coated with a bonding metal layer 416, which contain substantially the same material as bonding layer 413. On the other side of substrate 418 is a layer of protective material 420, which protects substrate 418 from subsequent etching. In one embodiment, protective layer 420 also contains Au. Note that protective layer 420 generally contains conductive materials. This way, a conductive path can form from the p-type InGaAlN layer through bonding layer 416, substrate 418, and protective layer 420.

In step E, after bonding, a layered structure 422, which includes two substrates, is formed.

In Step F, growth substrate 402 is removed using, for example, wet etching based on KOH or HNA. Note that the resulting structure 424 includes substrate 418, because protective layer 420 protects substrate 418 from the wet etching.

In Step G, buffer layer 404 is removed using an RIE process to expose n-type InGaAlN layer 406. A Au/Ge/Ni Ohmic-contact layer 426 is deposited on the top surface of n-type InGaAlN layer 406, which exhibits N-polar polarity. In one embodiment, this fabrication step uses PVD methods, such as electron-beam evaporation, filament evaporation, or sputter deposition. In one embodiment, Ohmic-contact layer 426 contains of Au, Ge and Ni with the following preferred composition by weight: 0-5% Ni, 10%-15% Ge, and 80%-90% Au. In other embodiments, the composition of Ohmic-contact layer 426 can be a combination of one or more high work function elements such as Au, Ni and Pt, and one or more group IV elements such as Si and Ge.

The exemplary fabrication processes described above use specific InGaAlN light-emitting devices as examples. However, the general device structures described herein are applicable to a wide range of semiconductor light-emitting devices. For example, an InGaAlN-based layered structure can be fabricated on a sapphire or SiC substrate. Typically, a buffer layer is present between the InGaAlN-based device and the substrate to resolve lattice and thermal mismatch. Commonly used compounds for the buffer layer include $In_xGa_yAl_{1-x-y}N$ ($0 \leq x \leq 1$; $0 \leq y \leq 1$), $In_xGa_yAl_{1-x-y}P$ ($0 \leq x \leq 1$; $0 \leq y \leq 1$); and $In_xGa_yAl_{1-x-y}As$ ($0 \leq x \leq 1$; $0 \leq y \leq 1$).

The foregoing descriptions of embodiments of the present invention have been presented only for purposes of illustration and description. They are not intended to be exhaustive or to limit the present invention to the forms disclosed. Accordingly, many modifications and variations will be apparent to practitioners skilled in the art. Additionally, the above disclosure is not intended to limit the present invention. The scope of the present invention is defined by the appended claims.

What is claimed is:

1. A semiconductor light-emitting device, comprising:
   a substrate;
   a p-type doped InGaAlN layer;
   an n-type doped InGaAlN layer;
   an active layer situated between the p-type doped and n-type doped InGaAlN layers; and
   an n-side Ohmic-contact layer coupled to an N-polar surface of the n-type doped InGaAlN layer, the Ohmic-contact layer comprising at least one alloy selected from the group consisting of a Au/Ge alloy, a Ni/Ge alloy, a Au/Si alloy, a Ni/Si alloy, a Au/Ni/Si alloy, and a Au/Ge/Ni alloy.

2. The semiconductor light-emitting device of claim 1, wherein the n-side Ohmic-contact layer does not contain Al.

3. The semiconductor light-emitting device of claim 1, wherein the n-side Ohmic-contact layer comprises Au, and Ge.

4. The semiconductor light-emitting device of claim 3, wherein the n-side Ohmic-contact layer comprises Au, Ge, and Ni;
   wherein the weight percentage of Ni in the n-side Ohmic-contact layer is not greater than 15%;
   wherein the weight percentage of Ge in the n-side Ohmic-contact layer is not less than 10% and not greater than 15%; and
   wherein the weight percentage of Au in the n-side Ohmic-contact layer is not less than 80% and not greater than 90%.

5. The semiconductor light-emitting device of claim 1, further comprising a Ni layer coupled to the n-side Ohmic-contact layer.

6. The semiconductor light-emitting device of claim 1, further comprising an Au layer coupled to the n-side Ohmic-contact layer.

7. The semiconductor light-emitting device of claim 1, further comprising:
   a p-side Ohmic-contact layer coupled to the p-type doped InGaAlN layer; and
   a bonding-material layer between the substrate and the p-side Ohmic-contact layer.

8. The semiconductor light-emitting device of claim 7, wherein the bonding-material layer comprises Au.

9. The semiconductor light-emitting device of claim 1, wherein the substrate comprises Si or Cr.

* * * * *